(12) United States Patent
Hur

(10) Patent No.: US 7,786,517 B2
(45) Date of Patent: Aug. 31, 2010

(54) SEMICONDUCTOR DEVICE INCLUDING A SELECTIVELY FORMED ETCH STOPPING LAYER AND METHODS THEREOF

(75) Inventor: Ki-Jae Hur, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 277 days.

(21) Appl. No.: 11/785,304

(22) Filed: Apr. 17, 2007

(65) Prior Publication Data

US 2007/0278599 A1    Dec. 6, 2007

(30) Foreign Application Priority Data

May 8, 2006    (KR)    .................. 10-2006-0041183

(51) Int. Cl.
*H01L 29/78*    (2006.01)
(52) U.S. Cl. .................. 257/288; 257/382; 257/900; 257/E29.128
(58) Field of Classification Search .................. 257/411, 257/288, 382, 900, E29.128
See application file for complete search history.

(56) References Cited

U.S. PATENT DOCUMENTS

| | | | | |
|---|---|---|---|---|
| 5,162,259 | A * | 11/1992 | Kolar et al. | 438/642 |
| 6,146,978 | A * | 11/2000 | Michael et al. | 438/453 |
| 6,326,270 | B1 * | 12/2001 | Lee et al. | 438/279 |
| 2006/0255384 | A1 * | 11/2006 | Baars et al. | 257/296 |

FOREIGN PATENT DOCUMENTS

| | | |
|---|---|---|
| JP | 10-209070 | 8/1998 |
| KR | 100252039 | 1/2000 |
| KR | 100257766 | 3/2000 |
| KR | 1020040063352 | 7/2004 |
| KR | 1020050032003 | 4/2005 |

* cited by examiner

*Primary Examiner*—Minh-Loan T Tran
(74) *Attorney, Agent, or Firm*—Harness, Dickey, Pierce, P.L.C.

(57) ABSTRACT

A semiconductor device and method of forming the same are provided. The example semiconductor device may include a gate pattern including a gate electrode and a capping layer pattern on a semiconductor substrate, a spacer covering first and second sidewalls of the gate pattern, an impurity injection region formed in the semiconductor substrate adjacent to the gate pattern and an etch stopping layer covering a surface of the semiconductor substrate adjacent to the spacer, the etch stopping layer substantially not covering the first and second sidewalls of the spacer and an upper surface of the capping layer pattern. An example method of forming a semiconductor device may include selectively forming an etch stopping layer in a semiconductor substrate by injecting ions into the semiconductor substrate, the semiconductor substrate having a composition which reacts with the injected ions to form the etch stopping layer, the injected ions also injected into structural elements mounted on the semiconductor substrate, the structural elements having a composition which does not react with the injected ions to form the etch stopping layer.

9 Claims, 5 Drawing Sheets

SEMICONDUCTOR DEVICE INCLUDING A SELECTIVELY FORMED ETCH STOPPING LAYER AND METHODS THEREOF

PRIORITY STATEMENT

This U.S. non-provisional patent application claims priority under 35 U.S.C §119 of Korean Patent Application 2006-41183 filed on May 8, 2006, the entire contents of which are hereby incorporated by reference.

BACKGROUND OF THE INVENTION

1. Field of the Invention

Example embodiments of the present invention relate generally to a semiconductor device and methods thereof, and more particularly to a semiconductor device including a selectively formed etch stopping layer and methods thereof.

2. Description of the Related Art

As semiconductor devices become more highly integrated, a width and an interval of wires included therein may become narrower. During a formation of a contact hole among parallel wires, an alignment margin of a photolithography process may decrease such that a bad contact or contact failure may be generated. A process for forming a contact hole of a highly integrated semiconductor device may include forming a self-aligned contact hole to improve the alignment margin, as will now be described with respect to FIGS. 1 to 4.

FIGS. 1 to 4 are cross-sectional views illustrating a process of forming a conventional semiconductor device. Referring to FIG. 1, a gate pattern 9 including a gate insulation layer 3, a gate electrode 5 and a capping layer pattern 7 stacked on a semiconductor substrate 1 may be formed. An impurity injection region 13 may be formed in both sides of the gate pattern 9 of the semiconductor substrate 1. Spacers 11 covering both sidewalls of the gate pattern 9 may be formed. An etch stopping layer 15 may be conformably formed on the semiconductor substrate 1. An interval of the gate pattern 9 and a neighboring (e.g., adjacent) gate pattern 9 may be narrowed or reduced by the etch stopping layer 15.

Referring to FIG. 2, an interlayer dielectric layer 17 may be formed on the semiconductor substrate 1 where the etch stopping layer 15 may be formed. As shown, a void V may be formed between adjacent gate patterns 9 (e.g., with an intervening portion narrowed or reduced by the etch stopping layer 15).

Referring to FIG. 3, an upper surface of the interlayer dielectric layer 17 may be planarized to expose an upper surface of the etch stopping layer 15. A mask pattern 19 including an opening exposing a space of the gate patterns 9 may be formed on the interlayer dielectric layer 17. The mask pattern 19 may be used as an etch mask to remove the interlayer dielectric layer 17 between the gate patterns 9 and to form a contact hole 20 exposing the etch stopping layer 15. The exposed etch stopping layer 15 may be etched by the contact hole 20. Because the etch stopping layer 15 may not be easily etched in the relatively narrow portion between the adjacent gate patterns 9, the semiconductor substrate 1 may be not exposed because a portion of the etch stopping layer 15A may remain after the etching process.

In conventional highly integrated semiconductor devices, an interval of adjacent gate patterns 9 may be narrower such that the etch stopping layer 15 covering a sidewall of the spacer 11 between the adjacent gate patterns 9 may reach the etch stopping layer 15 covering a sidewall of another spacer 11 facing the spacer 11. If the remaining portion of the etching stopping layer 15A covers the sidewalls of adjacent spacers, a probability that the remaining portion of the etching stopping layer 15A will block an exposure of the semiconductor substrate 1 may be increased.

Referring to FIG. 4, a conductive material may fill the contact hole 20 to form a contact plug 21. However, as shown in FIG. 4, the contact plug 21 may not contact the impurity injection region 13 because of the remaining portion of the etch stopping layer 15A. Accordingly, a contact failure may be generated because a conductive path may not be achieved between the contact plug 21 and the impurity injection region 13, which may cause semiconductor devices to function improperly.

SUMMARY OF THE INVENTION

An example embodiment of the present invention is directed to a semiconductor device, including a gate pattern including a gate electrode and a capping layer pattern on a semiconductor substrate, a spacer covering first and second sidewalls of the gate pattern, an impurity injection region formed in the semiconductor substrate adjacent to the gate pattern and an etch stopping layer covering a surface of the semiconductor substrate adjacent to the spacer, the etch stopping layer substantially not covering the first and second sidewalls of the spacer and an upper surface of the capping layer pattern.

Another example embodiment of the present invention is directed to a method of forming a semiconductor device, including forming a gate pattern including a gate electrode and a capping layer pattern on a semiconductor substrate, forming an impurity injection region on the semiconductor substrate adjacent to the gate pattern, forming a spacer covering first and second sidewalls of the gate pattern and forming an etch stopping layer covering a surface of the semiconductor substrate adjacent to the spacer, the etch stopping layer substantially not covering the first and second sidewalls of the spacer and an upper surface of the capping layer pattern.

Another example embodiment of the present invention is directed to a method of forming a semiconductor device, including selectively forming an etch stopping layer in a semiconductor substrate by injecting ions into the semiconductor substrate, the semiconductor substrate having a composition which reacts with the injected ions to form the etch stopping layer, the injected ions also injected into structural elements mounted on the semiconductor substrate, the structural elements having a composition which does not react with the injected ions to form the etch stopping layer.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Figure 1:
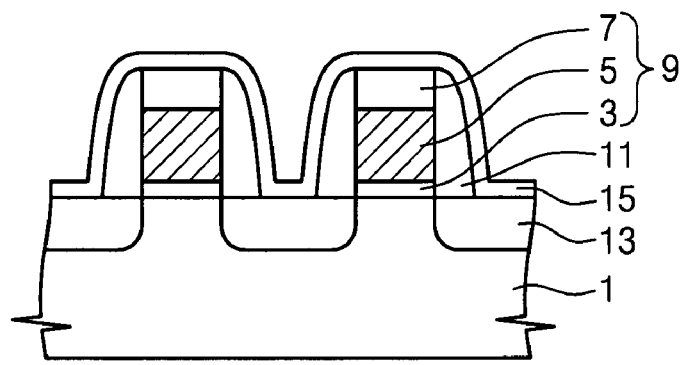
FIGS. 1 to 4 are cross-sectional views illustrating a process of forming a conventional semiconductor device.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", "on" versus "directly on", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 5 to 10 are cross-sectional views illustrating a process of forming a semiconductor device according to an example embodiment of the present invention.

Figure 5:
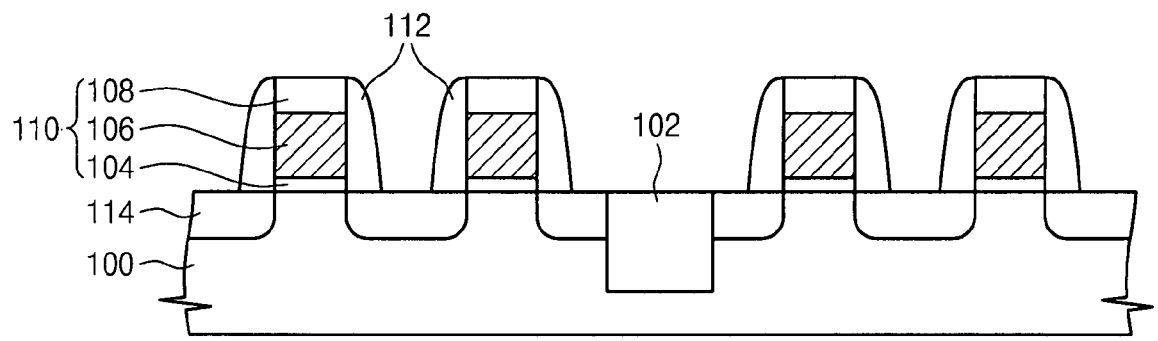
FIGS. 5 to 10 are cross-sectional views illustrating a process of forming a semiconductor device according to an example embodiment of the present invention.

In the example embodiment of FIG. 5, a device isolation layer 102 may be formed in a semiconductor substrate 100 to define an active region. In an example, the device isolation layer 102 may be formed with a shallow trench isolation process. In another example, the device isolation layer 102 may include a material of silicon oxide layer series. A gate pattern 110 including a gate insulation layer 104, a gate electrode 106 and a capping layer pattern 108, which are sequentially stacked, may be formed on the semiconductor substrate 100 with the isolation layer 102 formed thereon. In an example, the gate insulation layer 104 may be formed of a thermal oxide layer, the gate electrode 106 may be formed of a conductive layer and the capping layer pattern 108 may be formed of silicon nitride layer. The gate pattern 110 may be used as an ion implantation mask to form an impurity injection region 114 on the semiconductor substrate. The impurity injection region 114 may be a source/drain region. A spacer 112 covering both sidewalls of the gate pattern 110 may be formed. In an example, the spacer 112 may include the same material as the capping layer pattern 108, for example, a silicon nitride layer.

Figure 6:
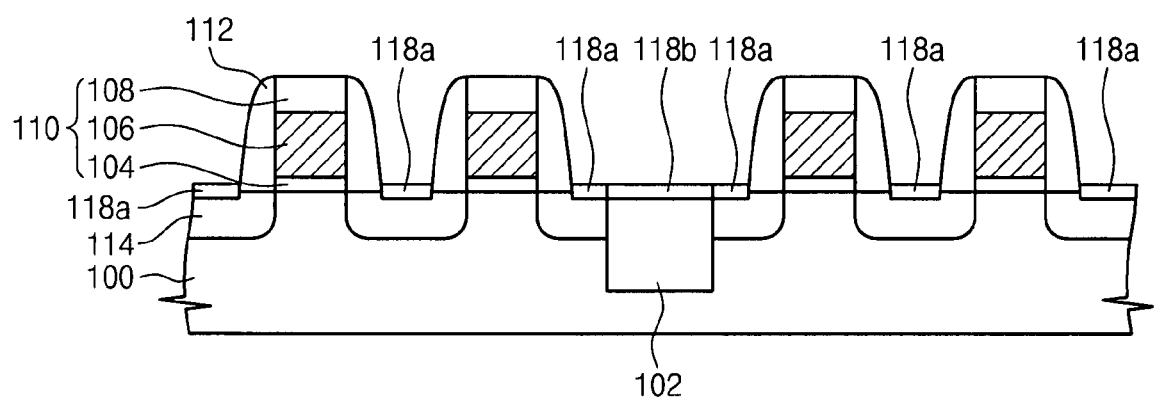

In the example embodiment of FIG. 6, etch stopping layers 118A and 118B may be formed on the semiconductor substrate 100 between the spacer 112 and a neighboring (e.g., adjacent) spacer 112 and on the device isolation layer 102. The etch stopping layers 118A and 118B may include a first etch stopping layer 118A on a surface of the semiconductor substrate 100 and a second etch stopping layer 118B on a surface of the device isolation layer 102. In an example, the etch stopping layers 118A and 118B may be formed by injecting ions of atoms included within the capping layer pattern 108 and the spacer 112 but not included within the semiconductor substrate 100 to the surface of the semiconductor substrate 100 and applying a heat-treatment process to react the injected atoms to the surface of the semiconductor substrate 100. For example, ions of atoms may be injected at a concentration of $10^{14}$~$10^{15}$ atoms/cm$^2$ and at an energy of 0.1~15 KeV, and the heat-treatment process may be performed within a heat range of 700~1000° C. Alternatively, the etch stopping layers 118A and 118B may be formed by exposing the surface of the semiconductor substrate 100 in a gas plasma including the capping layer pattern 108 and the spacer 112 but not including the semiconductor substrate 100. For example, during the plasma exposure, a temperature between 200~500° C. may be reached. In another example, if the capping layer pattern 108 and the spacer 112 include a silicon nitride layer and the semiconductor substrate 100 includes a silicon single crystal, the gas plasma may include nitrogen. Accordingly, in an example, the gas plasma be any gas including nitrogen, such as nitrogen gas $N_2$, ammonia gas $NH_3$, etc. Thus, by reacting nitrogen with silicon, the first etch stopping layer 118A may be formed of a silicon nitride layer. If a natural oxide layer is formed on the semiconductor substrate 100 before the etch stopping layers 118A and 118B are formed, the natural oxide layer may be selectively reduced or removed. If the natural oxide layer is not reduced or removed, the first etch stopping layer 118A may include a silicon oxynitride layer. If the device isolation layer 102 is formed of a material of silicon oxide layer series, the second etch stopping layer 118B may include a silicon oxynitride layer. Bottom surfaces of the etch stopping layers 118A and 118B may be formed lower than an upper surface of the semiconductor substrate 100.

In the example embodiment of FIG. 6, the etch stopping layers 118A and 118B may not be formed on a sidewall of the spacer 112 and/or an upper surface of the capping layer pattern 108. For example, if the capping layer pattern 108 and the spacer 112 include silicon nitride layer and the applied plasma gas includes nitrogen, silicon may already couple with nitrogen in and/or on the capping layer pattern 108 and the spacer 112, and as such there may be a reduced amount of silicon reacting to ions or plasma of nitrogen even though the capping layer pattern 108 and the spacer 112 may be exposed to ions or plasma of nitrogen. Accordingly, the etch stopping layers 118A and 118B may not be formed on the sidewall of the spacer 112 and the upper surface of the capping layer pattern 108. Rather, the etch stopping layers 118A and 118B may substantially be formed on the semiconductor substrate 100 and the device isolation layer 102. Accordingly, an interval or distance between adjacent gate patterns may be increased as compared to the conventional art because the "thickness" of the etch stopping layers 118A and 118B may be more selectively applied.

Figure 2:
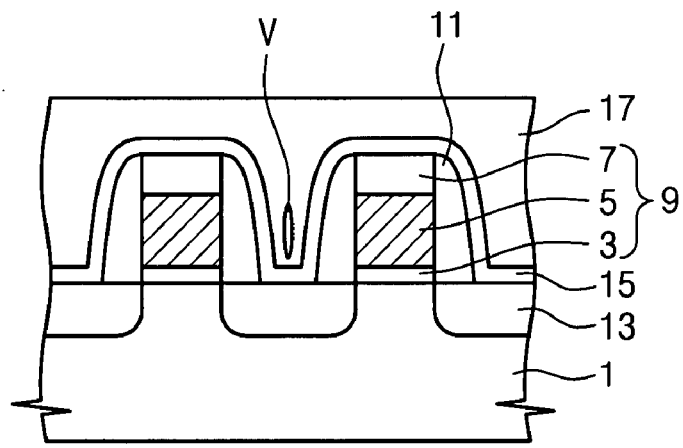
Figure 3:
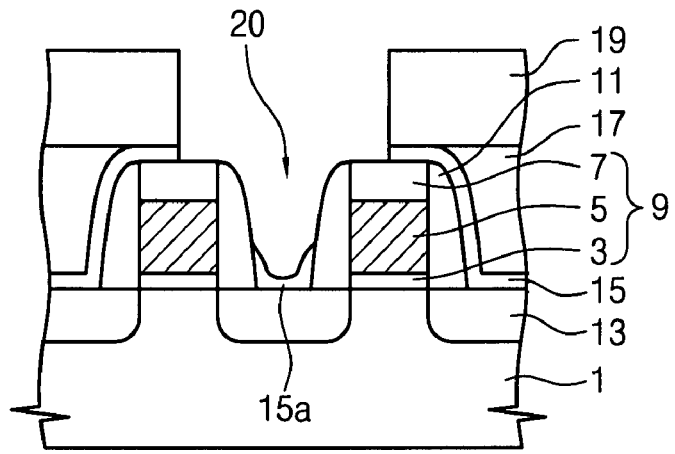
Figure 4:
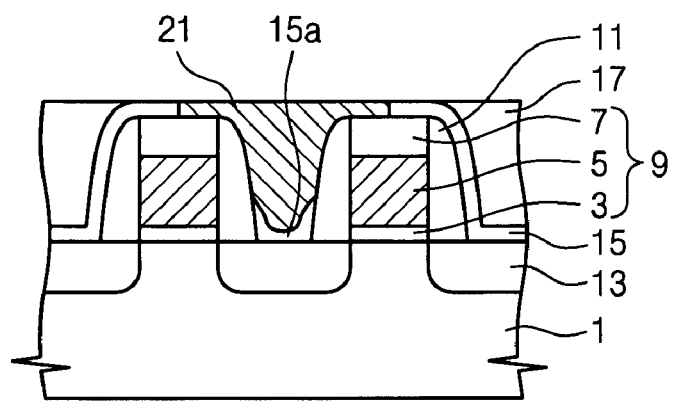
Figure 7:
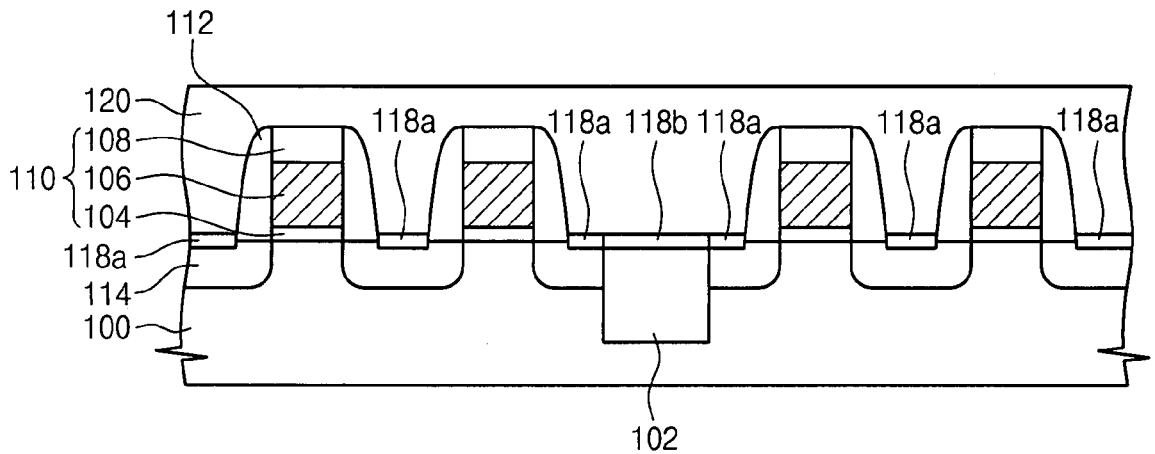

In the example embodiment of FIG. 7, an interlayer dielectric layer 120 may be formed on the semiconductor substrate 100 where the etch stopping layers 118A and 118B are formed. In an example, the interlayer dielectric layer 120 may include a material having an etch selectivity with respect to each of the etch stopping layers 118A and 118B. For example, the interlayer dielectric layer 120 may include one or more of a silicon oxide layer series. As shown in the example embodiment of FIG. 7, a void (e.g., as shown in conventional FIG. 2) need not be formed between the gate patterns 110.

Figure 8:
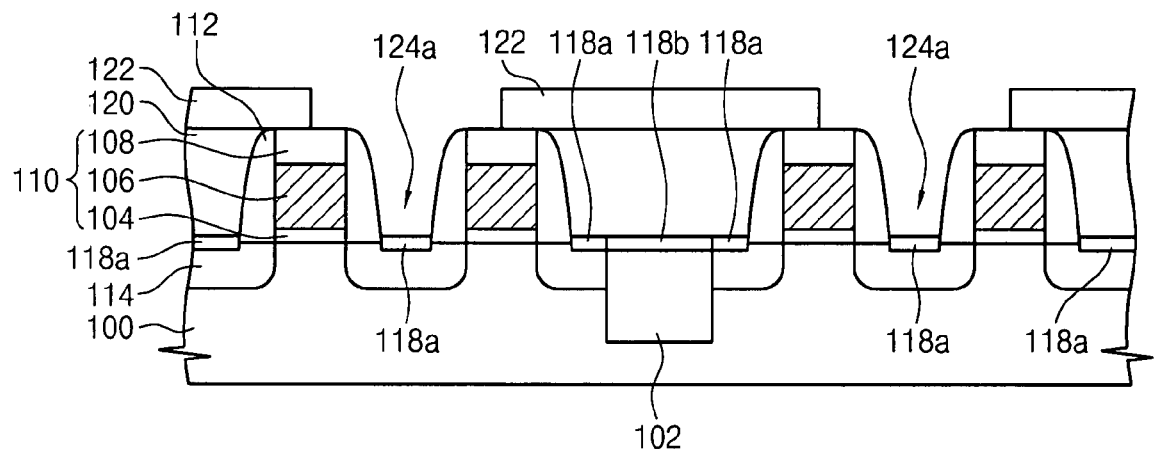

In the example embodiment of FIG. 8, an upper surface of the interlayer dielectric layer 120 may be planarized so as to expose an upper surface of the capping layer pattern 108. A mask pattern 122 may be formed so as to expose the interlayer dielectric layer 120 between adjacent or neighboring gate patterns 110 on the interlayer dielectric layer 120. The mask pattern 122 may be used as an etch mask to reduce or remove the interlayer dielectric layer 120 between the gate patterns 110 and to form a preliminary contact hole 124A. The first etch stopping layer 118A may be exposed by the preliminary contact hole 124A.

Figure 9:
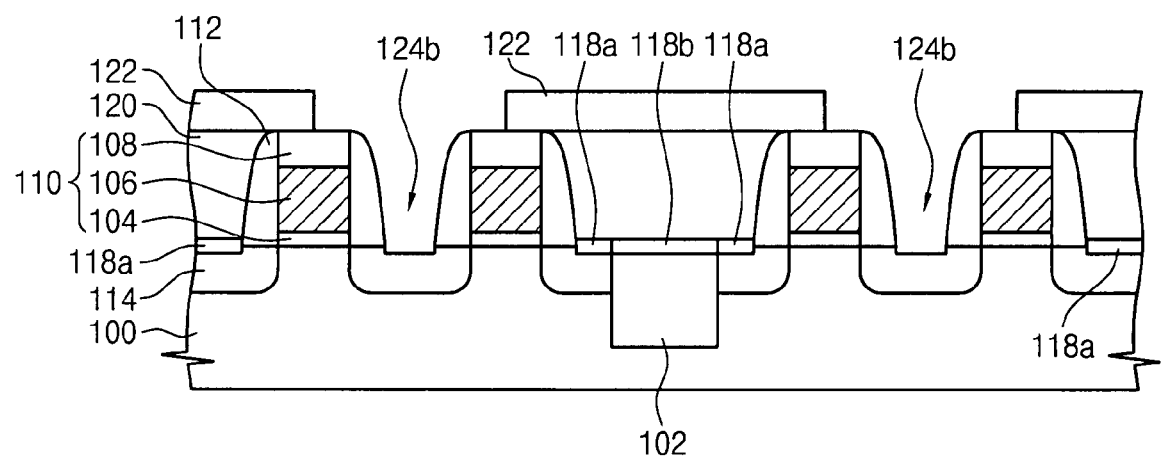

In the example embodiment of FIG. 9, the first etch stopping layer 118A exposed by the preliminary contact hole 124A may be reduced or removed to form a contact hole 124B exposing a surface of the semiconductor substrate 100. Because an interval of the spacers 112 may be relatively wide and an etchant (e.g., or etching chemistry) may reach a bottom of the preliminary contact hole 124A relatively easily, the first etch stopping layer 118A may be reduced or removed relatively easily by the etchant.

Figure 10:
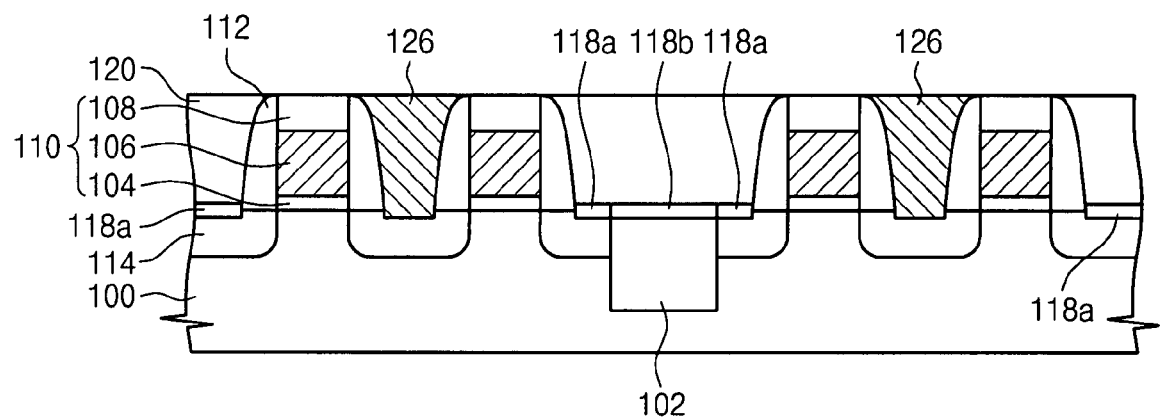

In the example embodiment of FIG. 10, a conductive material may at least partially fill the contact hole 124B to form a contact plug 126 bordering the impurity injection region 114. In an example, the contact plug 126 may include at least one of a metal silicide layer, a metal nitride layer and a metal layer. In another example, the probability of a contact failure may be reduced as compared to the conventional art.

In the example embodiment of FIG. 10, the device isolation layer 102 may be positioned in the semiconductor substrate 100, and the plurality of gate patterns 110 and spacers 112 covering a sidewall of each gate pattern 110 may be positioned on the semiconductor substrate 100. The impurity injection region 114 may be arranged on the semiconductor substrate 100 adjacent to the respective gate patterns 110. The first etch stopping layer 118A may be arranged on the semiconductor substrate 100 of a given side of the spacer 112 and the second etch stopping layer 118B may be arranged on the device isolation layer 102. The contact plug 126, which may be positioned between two neighboring or adjacent gate patterns 110, may be relatively close in proximity to the impurity injection region 114 formed on the semiconductor substrate 100 and to the given side of the spacer 112.

In another example embodiment of the present invention, because an etch stopping layer may expose or not cover gate patterns and sidewalls of spacers while not exposing or covering a semiconductor substrate between the gate patterns, an aspect ratio of an interval between adjacent or neighboring gate patterns may increase as compared to conventional etch stopping layers. Accordingly, a step coverage of an interlayer dielectric layer may be improved and structural malformations, such as contact failures, may be reduced (e.g., in a highly integrated semiconductor device).

Example embodiments of the present invention being thus described, it will be obvious that the same may be varied in many ways. For example, while the example embodiments are generically directed to a chemical reaction between a gas plasma containing nitrogen and a silicon to generate the etch stopping layers, it is understood that other example embodiments of the present invention may be directed to forming the etch stopping layers using other elements and/or with other processes other than a gas plasma injection chemical process.

Such variations are not to be regarded as a departure from the spirit and scope of example embodiments of the present invention, and all such modifications as would be obvious to one skilled in the art are intended to be included within the scope of the following claims.

what is claimed is:

1. A semiconductor device, comprising:
    a gate pattern including a gate electrode and a capping layer pattern on a semiconductor substrate;
    a spacer covering first and second sidewalls of the gate pattern;
    an impurity injection region formed in the semiconductor substrate adjacent to the gate pattern, the impurity injection region including a first impurity injection region adjacent to the first sidewall of the gate pattern, and a second impurity injection region adjacent to the second sidewall of the gate pattern, where the first sidewall and the second sidewall are opposite to each other; and
    an etch stopping layer covering the first impurity injection region, the etch stopping layer not substantially covering the spacer, an upper surface of the capping layer pattern, and the second impurity injection region.

2. The semiconductor device in claim 1, further comprising:
    an interlayer dielectric layer adjacent to a sidewall of the spacer and an upper surface of the etch stopping layer, the interlayer dielectric layer having an etch selectivity with the etch stopping layer.

3. The semiconductor device in claim 1, wherein the etch stopping layer includes a same material as that of the spacer and the capping layer pattern.

4. The semiconductor device in claim 1, wherein the etch stopping layer includes at least one of a silicon nitride layer and a silicon oxynitride layer.

5. The semiconductor device in claim 1, further comprising:
    a device isolation layer formed on the semiconductor substrate to define an active region,
    wherein a portion of the etch stopping layer is positioned on a surface of the device isolation layer.

6. The semiconductor device in claim 5, wherein the portion of the etch stopping layer positioned on the device isolation layer includes a silicon oxynitride layer.

7. The semiconductor device in claim 1, wherein the etch stopping layer is recessed into the first impurity region such that a bottom surface of the etch stopping layer is lower than an upper surface of the semiconductor substrate.

8. The semiconductor device in claim 1, further comprising:
    a contact plug adjacent to the spacer formed on the second sidewall of the gate pattern.

9. The semiconductor device in claim 8, wherein the contact plug is recessed into the second impurity region such that a bottom surface of the contact plug is lower than the upper surface of the semiconductor substrate.

* * * * *